(12) United States Patent
Kubota et al.

(10) Patent No.: US 10,193,633 B2
(45) Date of Patent: Jan. 29, 2019

(54) OPTICAL TRANSMITTER APPARATUS

(71) Applicant: SUMITOMO ELECTRIC DEVICE INNOVATIONS, INC., Yokohama-shi (JP)

(72) Inventors: Shuichi Kubota, Yokohama (JP); Motoki Saji, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 15/800,418

(22) Filed: Nov. 1, 2017

(65) Prior Publication Data

US 2018/0123695 A1    May 3, 2018

(30) Foreign Application Priority Data

Nov. 1, 2016  (JP) ................................ 2016-214460
Nov. 1, 2016  (JP) ................................ 2016-214461

(51) Int. Cl.
*H04B 10/04*    (2006.01)
*H04B 10/50*    (2013.01)
(Continued)

(52) U.S. Cl.
CPC ............. *H04B 10/506* (2013.01); *G02B 6/00* (2013.01); *G02B 6/4206* (2013.01); *G02B 6/4214* (2013.01); *G02B 6/4246* (2013.01); *G02B 6/43* (2013.01); *H01S 5/4012* (2013.01); *G02B 27/283* (2013.01); *G02B 27/30* (2013.01); *H01S 5/0071* (2013.01); *H01S 5/0078* (2013.01);
(Continued)

(58) Field of Classification Search
CPC ...... H04B 10/50; H04B 10/40; H04B 10/506; H04B 10/503; H04B 10/501; H04B 10/564; H04B 10/43; G02B 27/283; G02B 27/30; G02B 6/4249; G02B 6/12004; G02B 6/12007; G02B 6/12011; G02B 6/4257; G02B 6/4201; G02B 6/4214; G02B 6/4246; G02B 6/4204; G02B 6/42; G02B 6/424; G02B 6/43; G02B 6/4239; G02B 6/4286; H01S 5/0078; H01S 5/02236; H01S 5/02276; H01S 5/0427; H01S 5/0683
USPC ....... 398/135, 138, 139, 140, 141, 164, 182, 398/197, 200, 201, 38

See application file for complete search history.

(56) References Cited

U.S. PATENT DOCUMENTS 6,791,150 B2 *  9/2004  Takagi ................ H01S 5/02415
                                                      257/432
6,806,547 B2 * 10/2004  Kohmoto ............ H01L 31/0203
                                                      257/433

(Continued)

FOREIGN PATENT DOCUMENTS

JP    H5327031 A    12/1993

*Primary Examiner* — Hibret Woldekidan
(74) *Attorney, Agent, or Firm* — Venable LLP; Michael A. Sartori; Kerri M. Patterson (57) ABSTRACT

A multi-lane optical apparatus is disclosed. The optical apparatus includes monitor photodiodes (mPD) whose number corresponds to a number of lanes. The mPDs are arranged in an array so as to intersect optical axes of the respective lanes. The mPD has a light-sensitive area and an electrode that are arranged on a diagonal connecting two corners. The light-sensitive area is disposed offset from the center of the mPD. The mPDs in outermost are disposed such that the respective electrodes face inward.

14 Claims, 11 Drawing Sheets

(51) Int. Cl.
*G02B 6/00* (2006.01)
*G02B 6/42* (2006.01)
*G02B 6/43* (2006.01)
*H01S 5/40* (2006.01)
*G02B 27/28* (2006.01)
*G02B 27/30* (2006.01)
*H01S 5/00* (2006.01)
*H01S 5/022* (2006.01)
*H01S 5/042* (2006.01)
*H01S 5/068* (2006.01)
*H01S 5/0683* (2006.01)

(52) U.S. Cl.
CPC ....... *H01S 5/02216* (2013.01); *H01S 5/02236* (2013.01); *H01S 5/02276* (2013.01); *H01S 5/02284* (2013.01); *H01S 5/0427* (2013.01); *H01S 5/0683* (2013.01); *H01S 5/06808* (2013.01); *H01S 5/4087* (2013.01)

(56) References Cited

U.S. PATENT DOCUMENTS

| | | | | |
|---|---|---|---|---|
| 7,155,129 | B2* | 12/2006 | Bringans | H04B 10/801 398/131 |
| 7,894,726 | B2* | 2/2011 | Kagaya | H01L 25/167 398/164 |
| 9,503,184 | B2* | 11/2016 | Grimm | G01V 8/20 |
| 9,819,147 | B2* | 11/2017 | Tanaka | H01S 5/06256 |
| 2002/0025123 | A1* | 2/2002 | Fujimura | G02B 6/4214 385/88 |
| 2004/0207926 | A1* | 10/2004 | Buckman | H04B 10/801 359/642 |
| 2011/0091207 | A1* | 4/2011 | Xie | H04B 10/564 398/38 |
| 2013/0259439 | A1* | 10/2013 | Asaba | G02B 6/32 385/140 |
| 2016/0129513 | A1* | 5/2016 | Oka | B23K 1/0016 372/38.07 |
| 2018/0088293 | A1* | 3/2018 | Toyonaka | G02B 6/4279 |
| 2018/0123697 | A1* | 5/2018 | Kubota | G02B 19/0009 |

* cited by examiner

OPTICAL TRANSMITTER APPARATUS

CROSS REFERENCE TO RELATED APPLICATIONS

The present application claims the benefit of priority of Japanese Patent Applications No. 2016-214460 and 2016-214461, each filed on Nov. 1, 2016, which are incorporated herein by reference.

BACKGROUND

1. Field of the Invention

The present invention relates to an optical transmitter apparatus, in particular, an optical transmitter apparatus capable of transmitting a number of optical signals each having wavelength specific thereof and different from each other.

2. Related Background Arts

A Japanese Patent Application laid open No. JP-05-327031 has disclosed an optical transmitter apparatus that includes a laser diode, an optical coupling system for guiding an optical beam generated in the laser diode to an outside of the optical transmitter apparatus, and a photodiode that senses power of the optical beam. A wavelength division multiplexing (WDM) technique becomes popular in a recent optical communication system. An optical transmitter applicable to the WDM system includes a number of optical sources that generate optical beams with wavelengths different from each other and an optical multiplexing system that multiplexes the optical signals and transmits a multiplexed optical signal into an optical fiber. Such an optical transmitter apparatus also implements a number of photodiodes each sensing power of the optical beams generating in the optical sources. However, physical dimensions of such an optical transmitter apparatus are usually defined in a standard and recently ruled standards have tendency to define a size of the optical transmitter apparatus smaller and smaller.

SUMMARY

An aspect of the present invention relates to an optical transmitter apparatus capable of transmitting a number of optical signals each having a wavelength specific thereto and difference from each other. The optical transmitter apparatus of the invention includes a number of optical modules, a number of photodiodes (PDs), a carrier and a housing. The optical modules generate the optical signals and have respective optical axes. The PDs, which sense power of the optical signals, each have a light-sensitive area and a first electrode connected to the light-sensitive area, where the PDs each have a rectangular plane shape, and the light-sensitive area and the first electrode are arranged on a diagonal of the rectangular plane shape. The carrier mounts the PDs thereon such that the PDs are arranged in an array on the carrier and intersects the optical axes of the optical signals. The housing has sides forming a space to enclose the optical modules, the PDs, and the carrier therein. A feature of the optical transmitter apparatus of the present invention is that the PDs disposed outermost on the carrier face the first electrodes thereof toward the PDs disposed inward on the carrier.

BRIEF DESCRIPTION OF THE DRAWINGS

The invention will be described in conjunction with the accompanying drawings, in which.

DETAILED DESCRIPTION

Next, embodiment according to the present invention will be described as referring to accompany drawings. In the description of the drawings, numerals or symbols same with or similar to each other will refer to elements same with or similar to each other without duplicating explanations.

Figure 1:
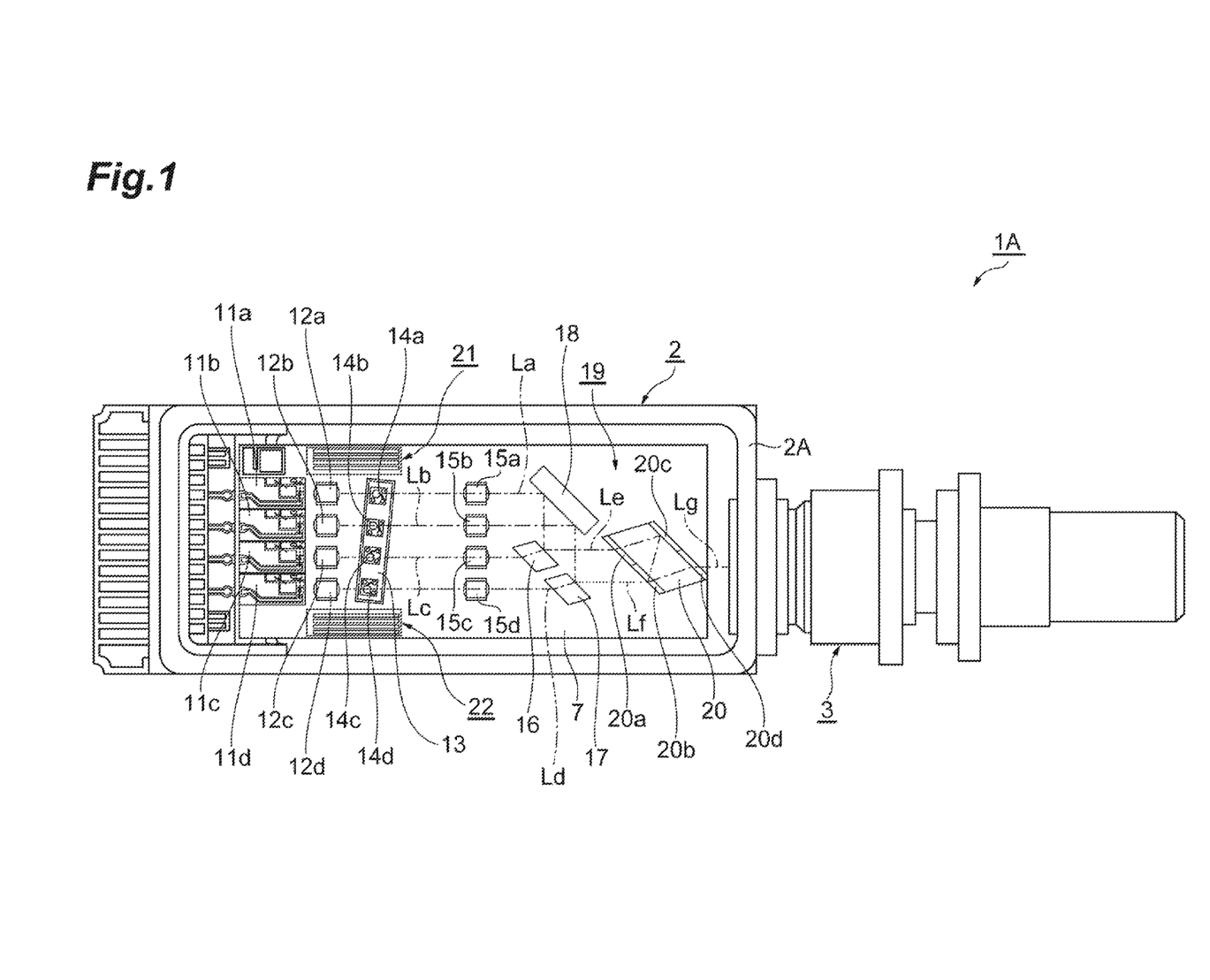
FIG. 1 is a plan view showing an inside of an optical transmitter apparatus according to embodiment of the present invention.
Figure 2:
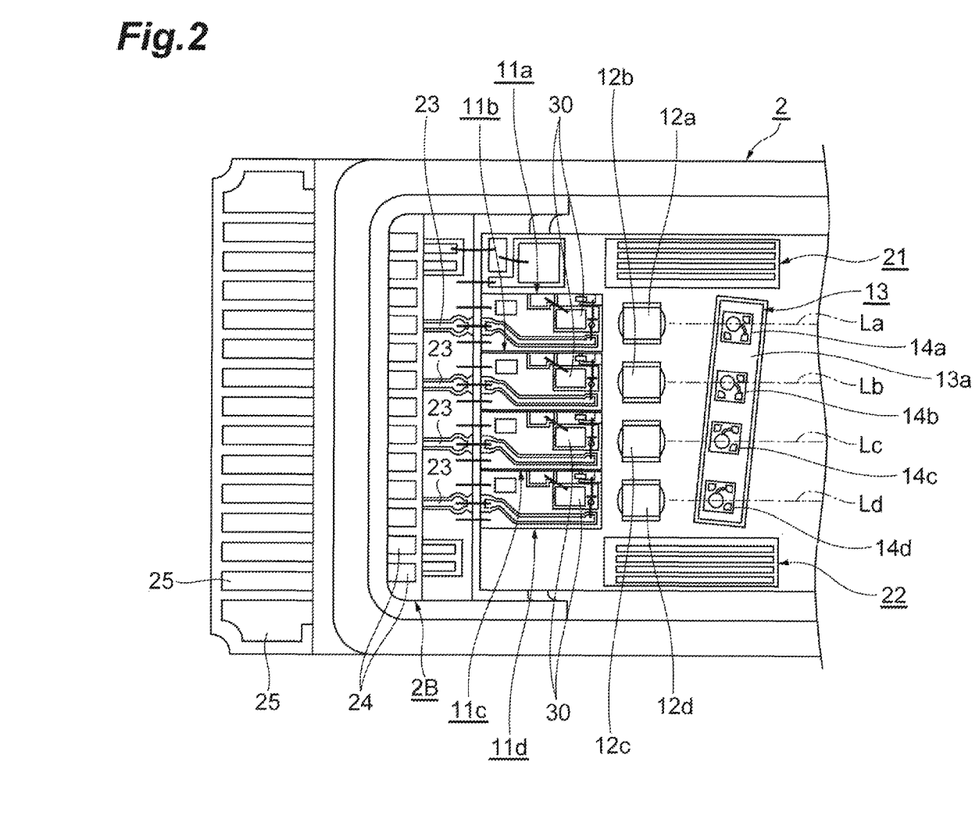
FIG. 2 magnifies a primary portion of the optical transmitter apparatus shown in FIG. 1.
Figure 3:
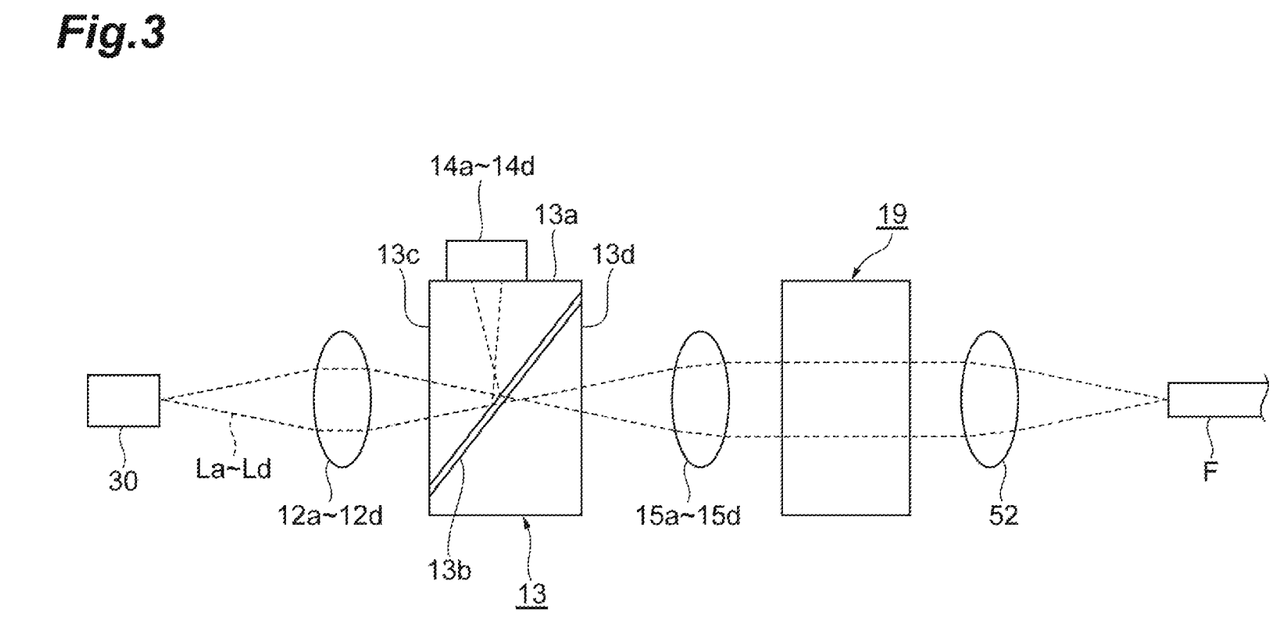
FIG. 3 schematically illustrates an optical coupling system form an optical source to an optical fiber in the optical transmitter apparatus.

FIG. 1 is a plan view showing an inside of an optical transmitter apparatus 1A according to the first embodiment of the present invention; FIG. 2 magnifies a portion of the inside of the optical transmitter apparatus 1A shown in FIG. 1; and FIG. 3 schematically illustrates an optical coupling system from an optical source to an optical fiber in the optical transmitter apparatus shown in FIG. 1. The optical transmitter apparatus 1A provides a box-shaped housing 2 and an optical coupling unit 3 with a cylindrical shape, where the optical transmitting apparatus 1A is sometimes called as a transmitter optical sub-assembly (TOSA).

The optical transmitter apparatus 1A may implement an N-count of optical modules, 11a to 11d, where N is an integer equal to or greater than 2, the N-count of first lenses, 12a to 12d, a beam splitter (BS) 13, the N-count of semiconductor light-receiving devices, typically semiconductor photodiodes (PDs), 14a to 14d, the N-count of second lenses, 15a to 15d, an optical multiplexing system 19, and circuit boards, 21 and 22. In the present embodiment, the optical transmitter apparatus 1A provides four (4) lanes of signal channels, which means that the N-count is equal to four (4). The optical modules, 11a to 11d, the first lenses, 12a to 12d, the BS 13, the second lenses, 15a to 15d, the optical multiplexing system 19, and the circuit boards, 21 and 22, are mounted on a plane surface of the base 7.

The housing 2 provides a feedthrough 2B in a rear wall thereof. In the description below, a direction of forward and/or front corresponds to a side where the coupling unit 3 is provided with respect to the housing 2, while, another direction of rear and/or back corresponds to a side where the feedthrough 2B is provided. However, those directions are distinguished only for the explanation sake, and could not affect the scope of the present invention. The feedthrough 2B, which passes the rear wall of the housing 2, provides a rear portion outside of the housing 2 where outer terminals 25 are provided for communicating with external apparatuses and arranged in an array. The feedthrough 2B in a portion inside of the rear wall provides inner terminals 24 and the N-count of signal interconnections 23 that form co-planar transmission lines. The N-count of signal interconnections 23 and the inner terminals 24 are connected to the outer terminals 25.

The optical transmitter apparatus 1A drives the optical modules, 11a to 11d, independently, which means that the optical modules, 11a to 11d, operable as optical sources may generate optical beams, La to Ld, independently. The optical beams, La to Ld, in optical axes thereof extend substantially parallel along a longitudinal direction of the housing 2. Driving signals for the optical modules, 11a to 11d, are supplied from an outside of the housing 2 through the terminals, 24 and 25, and the signal interconnection 23. The optical beams, La to Ld, are modulated in amplitudes thereof by the driving signals. The optical modules, 11a to 11d, each provide semiconductor elements that integrate semiconductor laser diodes (LDs) with semiconductor modulators. The optical modules, 11a to 11d, exactly, the semiconductor elements 30 in the optical modules, 11a to 11d, may generate the optical beams, La to Ld, whose wavelengths are within a 1.3 μm band but different from each other.

The first lenses, 12a to 12d, which are optically coupled with the optical modules, 11a to 11d, may convert the divergent beams, La to Ld, into convergent beams. That is, distances between semiconductor elements 30 in the optical modules, 11ad to 11d, and the first lenses, 12a to 12d, corresponding to the semiconductor elements 30 are set longer than focal lengths of the first lenses, 12a to 12d. Accordingly, the first lenses, 12a to 12d, may convert the divergent beams, La to Ld, into the convergent beams, as schematically shown in FIG. 3.

The BS 13, which has a rectangular block shape with a longitudinal direction perpendicular to the optical axes of the optical beams, La to Ld, is disposed between the first lenses, 12a to 12d, and the second lenses, 15a to 15d. The BS 13, as shown in FIG. 3, provides a multi-layered dielectric film 13b between two triangular blocks, where the multi-layered dielectric film 13b in a normal thereof is inclined with the optical axes of the optical beams, La to Ld. The multi-layered dielectric film 13b may reflect portions of the optical beams, La to Ld, as monitored beams toward the PDs, 14a to 14d, mounted on the top surface 13a of the BS 13 by ratios of 5 to 10%. The PDs, 14a to 14d, may receive the monitored beams and generate photocurrents corresponding to optical power of the optical beams, La to Ld. The PDs, 14a to 14d, are mounted on the BS 13 such that back surfaces thereof face and are in contact with the top surface 13a of the BS 13, where the PDs, 14a to 14d, have optically sensitive layers closer to top surfaces thereof. That is, the PDs, 14a to 14d, have an arrangement of, what is called, the back illumination. Thus, BS 13 operates as a carrier for the PDs, 14a to 14d.

The second lenses, 15a to 15d, are optically coupled with the first lenses, 12a to 12d, through the BS 13. The optical beams, La to Ld, once form respective beam waists after passing the BS 13, diverge again, and enter the second lenses, 15a to 15d. The second lenses, 15a to 15d, are disposed so as to align focuses thereof with the positions of the beam waists. Accordingly, the optical beams, La to Ld, output from the second lens, 15a to 15d, become substantially collimated beams.

The optical multiplexing system 19, which is optically coupled with the second lenses, 15a to 15d, may generate a multiplexed beam Lg by multiplexing the optical beams, La to Ld. The optical multiplexing system 19 of the present embodiment provides a first wavelength division multiplexing (WDM) filter 16, a second WDM filter 17, a mirror 18, and a polarization beam combiner (PBC) 20. The mirror 18 optically couples with the second lenses, 15a and 15b; specifically, the mirror 18, which is disposed such that a reflecting surface thereof is positioned on and inclined with the optical axes of the two of the second lenses, 15a and 15b, reflects two of the optical beams, La and Lb, toward the WDM filters, 16 and 17. The first WDM filter 16, which optically couples with the third second lens 15c; specifically, the first WDM filter 16, which is disposed such that a wavelength selective surface thereof faces to and inclines from the optical axis of the third optical beam Lc and the optical axis of the mirror 18, transmits the optical beam Lc coming from the second lens 15c and reflects the optical beam La coming from the mirror 18 so as to align the optical axes of the two optical beams, La and Lc, and generate a first multiplexed beam Le. The second WDM filter 17 optically couples with the mirror 18 and the fourth second lens 15d. Specifically, the WDM filter 17 is disposed such that the wavelength selective surface thereof faces to and inclines from the optical axis of the second optical beam Lb reflected by the mirror 18 and the fourth optical beam Ld coming from the fourth second lens 15d. Thus, the second WDM filter 17 reflects the optical beam Lb coming from the mirror 18 and transmits the optical beam Ld coming from the second lens 15d, which may align the optical axes of the two optical beams, Lb and Ld, to generate a second multiplexed beam Lf.

The PBC 20 has a transparent slab with an anti-reflection film 20a and a polarization combining film 20b in one surface thereof, and a reflection film 20c and another anti-reflection film 20d in another surface thereof. The first multiplexed beam Le coming from the first WDM filter 16 enters the former anti-reflection film 20a, reaches the reflection film 20c passing through the PBC 20, reflected thereby, and finally reaches the polarization combining film 20b. The second multiplexed beam Lf directly enters the polarization combining film 20b. One of the multiplexed beams, Le or Lf, passes, before entering the PBC 20, a half-wavelength plate (λ/2) that may rotate the polarization of the multiplexed beam by an angle of 90°, which is not shown in the figures. Accordingly, the multiplexed beams, Le and Lf, enter the polarization combining film 20b have respective polarizations perpendicular to each other. The polarization combining film 20b has a function such that a polarization component perpendicular to the incident plane is substantially reflected but substantially not transmitted, while, another polarization component parallel to the incident plane is substantially transmitted but substantially not reflected, where the incident plane may be formed by the optical axis of the incoming light and the normal of the polarization combining film 20b. Accordingly, the multiplexed beam Le having a polarization, for instance, parallel to a bottom of the housing 2 is almost reflected by the polarization combining film 20b but the other multiplexed beam Lf with a polarization perpendicular to the bottom of the housing 2 is almost transmitted through the polarization combining film 20b. Thus, two multiplexed beams, Le and Lf, are multiplexed by the PBC 20 and becomes the multiplexed beam Lg externally output from the optical transmitting apparatus 1A passing the anti-reflection film 20d and the window provided in the side 2A of the housing 2.

The coupling unit 3, which has the cylindrical shape, provides a third lens 52 and a fiber stub. The third lens 52 optically couples with the optical multiplexing system 19. The fiber stub secures a coupling fiber F shown in FIG. 3. The multiplexed beam Lg converges onto an end of the coupling fiber F by the third lens 52. The coupling unit 3 is fixed to the side 2A of the housing 2 after optically aligned with the optical axis of the multiplexed beam Lg. The optical coupling unit 3 may further include an optical isolator, which is not illustrated in the figures, that prevents incoming light from entering within the optical transmitting apparatus 1A.

Figure 4:
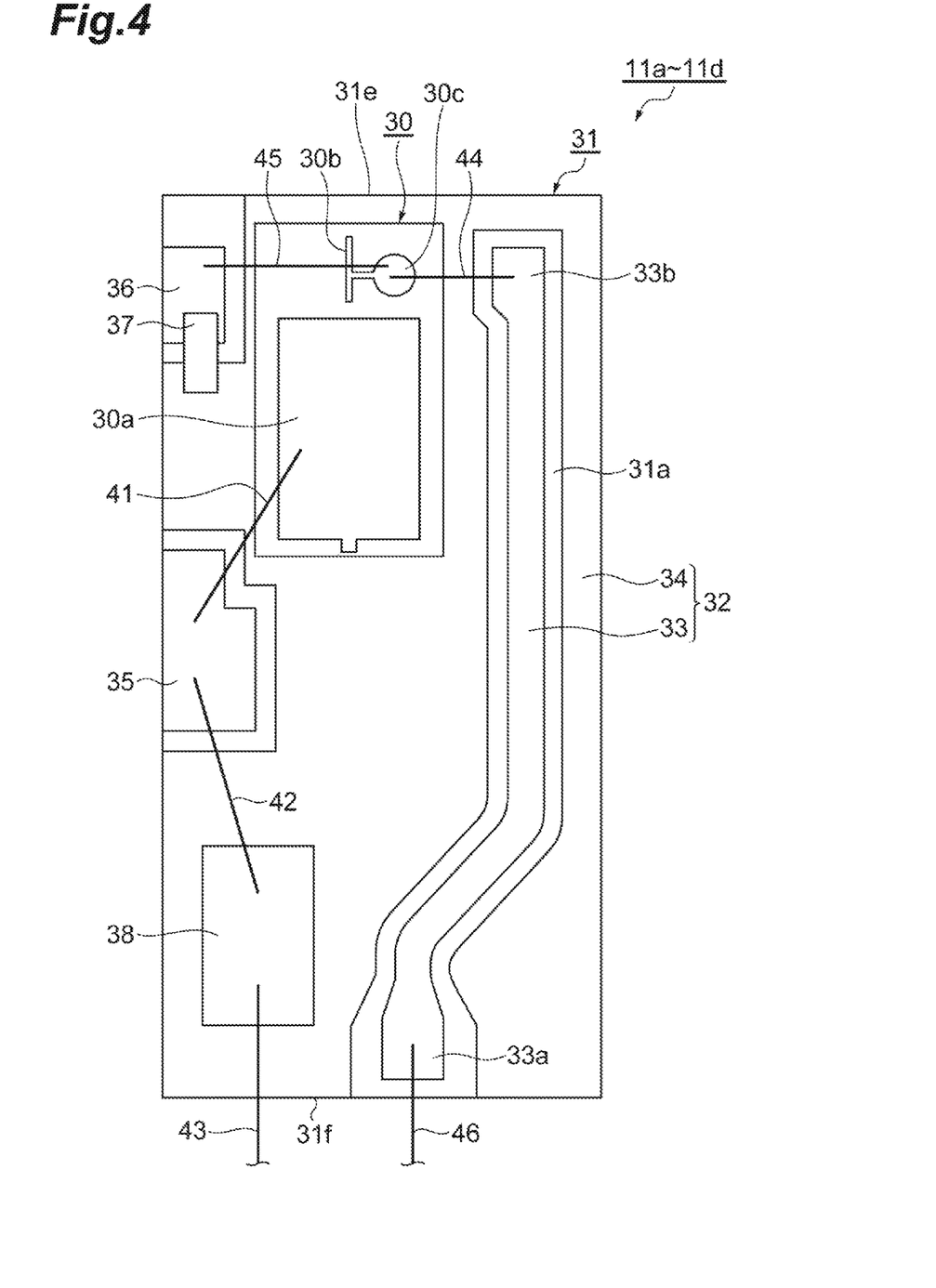
FIG. 4 is a plan view showing an optical module implemented within the optical transmitter apparatus.

Next, details of the optical modules, 11a to 11d, will be described. FIG. 4 is a plan view showing the optical modules, 11a to 11d, installed within the optical transmitter apparatus shown in FIG. 1. Because the optical modules, 11a to 11d, have arrangements equal to each other, the explanation below concentrates on the optical module 11a, and the descriptions may be applicable to the other optical modules, 11b to 11d. The optical module 11a provides a carrier 31 made of electrically insulating material and the semiconductor element 30 mounted on the carrier 31. The semiconductor element 30 of the present embodiment integrates the semiconductor modulator monolithically with the LD on the semiconductor substrate. The LD provides pad 30a as an anode electrode thereof, while, the semiconductor modulator provides another pad 30c connected with an anode electrode 30b of the semiconductor modulator. The former pad 30a supplies a bias current for driving the LD thereto, while, the latter pad 30c receives a driving signal for modulating the semiconductor modulator.

The top surface 31a of the carrier 31 provides a co-planar line 32, a ground pattern 34, a bias pad 35, and a termination pad 36. The co-planar line 32 in one end thereof is connected with the semiconductor element 30 to provide the driving signal there. Specifically, the co-planar line 32 includes a signal line 33 and the ground pattern 34 surrounding the signal line 33. The signal line 33, which extends from one edge 31e to another edge 31f of the carrier 31, provides a pad 33b closer to the one edge 31e, to which a bonding wire 44 is wire-bonded from the pad 30c on the semiconductor element 30. The signal line 33 in another end thereof closer to the other edge 31f also provides another pad 33a that is connected with the signal interconnection 23 on the feedthrough 2B with a bonding wire 46.

The ground pattern 34 covers the top surface 31a of the carrier 31 except for the signal line 33 of the co-planar line 32, the bias pad 35, and the termination pad 36. Thus, the ground pattern 34 sandwiches the signal line 33 of the co-planar line 32 with a preset gap therebetween. The semiconductor element 30 is mounted on the ground pattern 34 such that the back metal provided in the back surface thereof faces and is in contact with the ground pattern 34. The bias pad 35 is connected with the pad 30a on the semiconductor element 30 with a bonding wire 41, while, the termination pad 36 is connected with the pad 30c also on the semiconductor element 30 with a bonding wire 45. A terminator 37 connects the termination pad 36 with the ground pattern 34.

The ground pattern 34 also mounts a capacitor 38 of a type of die-capacitor. The capacitor 38 in a back electrode thereof faces and in contact with the ground pattern 34 by, for instance, solder or conductive resin. The top electrode of the capacitor 38 is wire-bonded with the terminals 24 provided on the feedthrough 2B and the bias pad 35 with bonding wires, 43 and 42, respectively.

Figure 5:
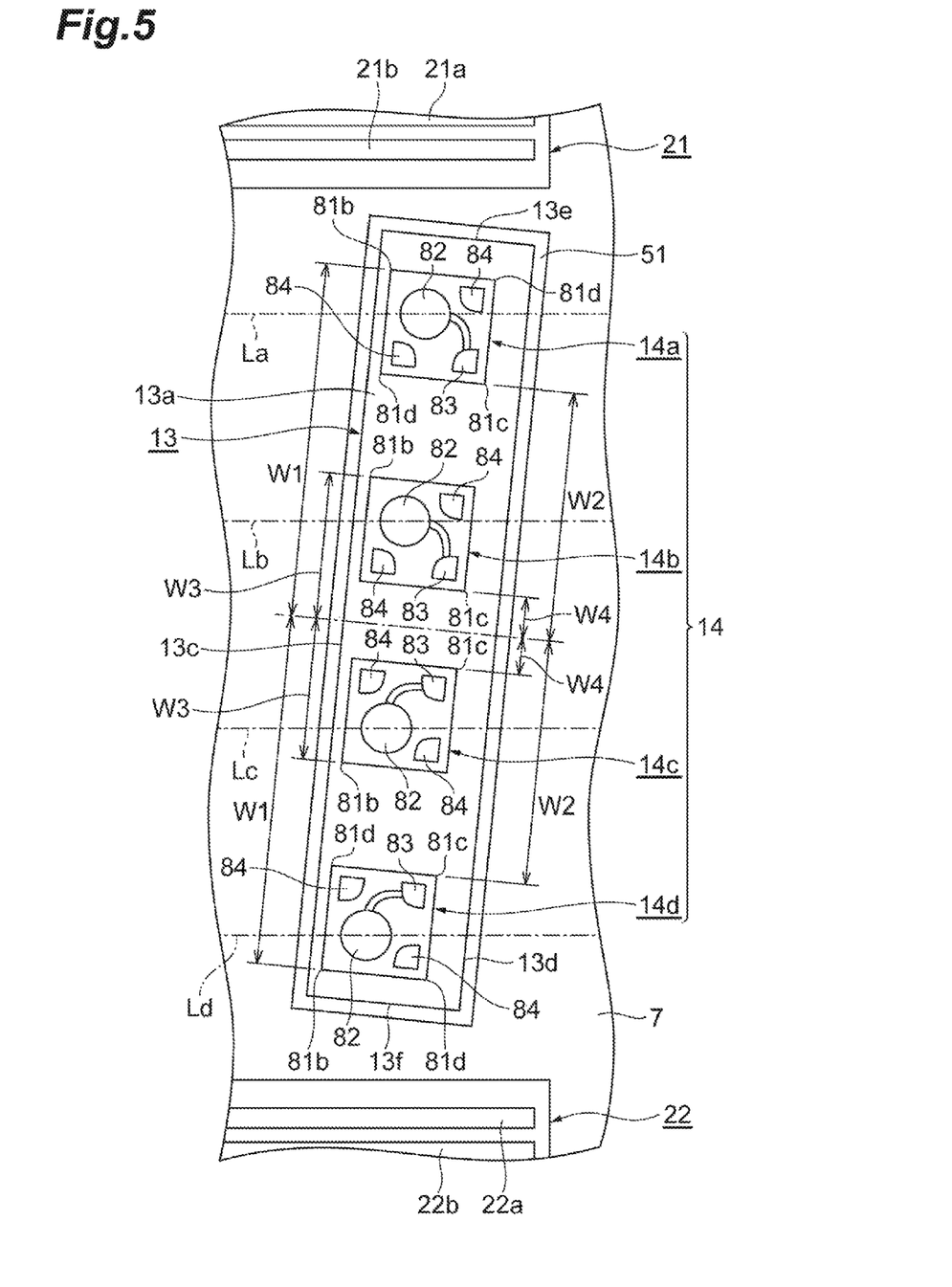
FIG. 5 is a magnified plan view of an optical splitter as a carrier and photodiodes mounted thereon according to the first embodiment of the present invention.

FIG. 5 is a magnified plan view of the BS 13 and the PDs, 14a to 14d. The BS 13, as already described, has the rectangular block shape with the top surface 13a, a front side 13e facing the first lenses, 12a to 12d, and a rear side 13d facing the second lenses, 15a to 15d. The front and rear sides, 13c and 13d, extend parallel to each other and perpendicular to the primary surface of the base 7. Also, the front and rear sides, 13c and 13d, in the normal thereof are slightly inclined with the optical axes of the optical beams, La to Ld, in order to prevent light reflected thereat from returning the semiconductor elements 30. The rectangular block of the BS 13 further provides side walls, 13e and 13f, opposite to and extending parallel to each other. The BS 13 is fixed on the primary surface of base 7 with adhesive 51.

Figure 6:
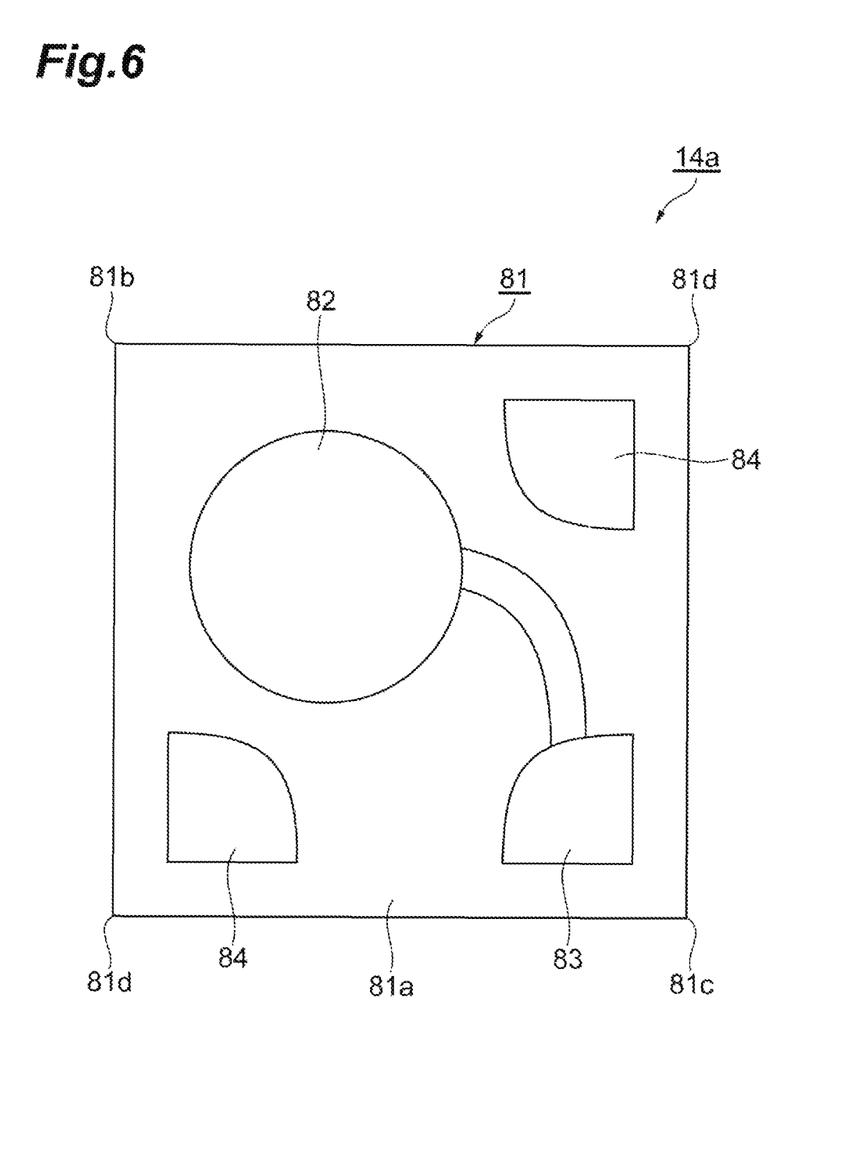
FIG. 6 is a plan view of a photodiode.

The PDs, 14a to 14d, are arranged in the array on the top surface 13a of the BS 13, where the array extending along and parallel to the front and rear sides, 13c and 13d, of the BS 13. That is, the direction of the array aligns with the longitudinal direction of the rectangular block of the BS 13 so as to make one of edges of the PDs, 14a to 14d, extending parallel to the front and rear sides, 13c and 13d. FIG. 6 is a plan view of one PD 14a. Other PDs, 14b to 14d, have arrangements same with that of the PD 14a shown in FIG. 6.

The PD 14a provides a semiconductor substrate 81 with a square top surface 81a formed by corners, 81b to 81d, where two corners, 81b and 81c, are arranged diagonally, while other two corners 81d are also arranged diagonally. That is, the one corner 81b, which will be called as the first corner, is disposed between the two corners 81d, and the second corner 81c, which will be called as the second corner, is also disposed between the two corners 81d.

The PD 14a also provides a light-receiving area 82, a first electrode 83, and a pair of second electrode 84. The light-sensitive area 82, which has semiconductor layers with a circular shape on the top surface 81a of the semiconductor substrate 81, may convert an optical signal entering therein into an electrical signal of a photocurrent. The light-sensitive area 82 is disposed closer to the first corner 81b offset from a center of the top surface 81a, that is, the light-sensitive area 82 has a center thereof closer to the corner 81b offset from the center of the top surface 81a. A disposition closer to the first corner 81b for the light-sensitive area 82 means that the center thereof is disposed closest to the first corner 81b but does not mean the center of the top surface 81a is not involved within the light-sensitive area 82.

The first electrode 83, which is a bonding pad formed on the top surface 81a, is electrically connected with a semiconductor layer with the first conduction type in the light-sensitive area 82, where the first conduction type may be the p-type. The first electrode 83 is disposed closer to the second corner 81c, specifically, between the center of the top surface 81a and the second corner 81c. That is, the light-sensitive area 82 and the first electrode 83 are arranged on one diagonal of the square top surface 81a.

The two second pads 84 are also bonding pads provided in the top surface 81a of the semiconductor substrate 81. The second pads 84 are connected with another semiconductor layer in the light-sensitive area 82 and having the second conduction type, which may be the n-type. The second pads 84 are disposed closer to rest of the corners 81d; specifically, one of the second pads 84 are disposed between the center of the semiconductor substrate 81 and the rest corners 81d. The second pads 84 are arranged on another diagonal of the square top surface 81a.

Referring back to FIG. 5, the light-sensitive areas 82 in the PDs, 14a to 14d, are disposed so as to overlap with the optical axes of the optical beams, La to Ld. That is, the optical beams, La to Ld, pass the centers of the light-sensitive areas 82. Also, the first and second PDs, 14a and 14b, which are disposed in an upper side in FIG. 5, are arranged such that the first corners 81b face the side 13e, or to be closer to the side 13c of the BS 13. Oppositely, the third and fourth PDs, 14c and 14d, are arranged on the BS 13 such that the first corners 81b thereof face, or are closer to the other side 13f of the BS 13. Describing further specifically, the first corner 81b of the first PD 14a and that of the fourth PD 14d make distances to the center of the BS 13, which are denoted by a symbol $W_1$ in FIG. 5, that is substantially equal to each other, and the first corner 81b of the second PD 14b and that of the third PD 14c also make distances to the center of the BS 13, which are denoted by a symbol $W_3$ in FIG. 5. That is, the third and fourth PDs, 14c and 14d, are arranged on the BS 13 as being rotated by 90° in counter clock wise (CCW) with respect to the former two PDs, 14a and 14b. Accordingly, the first corners 81b are arranged in outer sides with respect to the center of the BS 13 compared with corners 81c, or contrary, the first electrodes 83 are arranged inner side of the BS 13 compared with the light-sensitive area 82.

Figure 7:
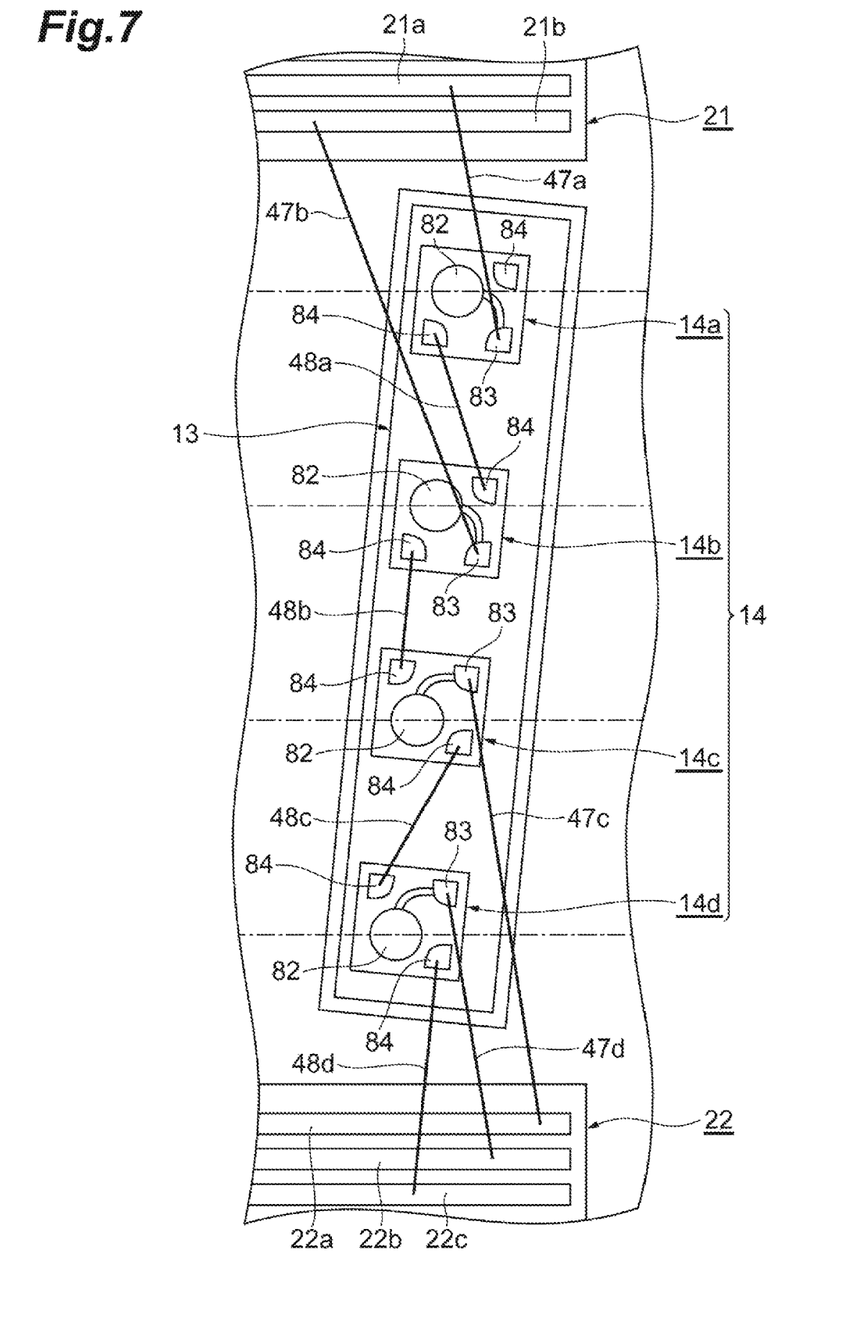
FIG. 7 is a plan view showing routings of bonding wires connecting the first and second electrodes with the first and second circuit boards.

FIG. 7 is a plan view that shows routings of bonding wires connecting the first and second electrodes, 83 and 84, of the PDs, 14a to 14d, with the first and second circuit boards, 21 and 22. The first electrodes 83 of the first and second PDs, 14a and 14b, are wire-bonded with interconnections, 21a and 21b, on the first circuit board 21 with bonding wires, 47a and 47b. Similarly, the first electrodes 83 of the third and fourth PDs, 14c and 14d, are wire-bonded with interconnections, 22a and 22b, on the second circuit board 22 with bonding wires, 47c and 47d. One of the second electrodes 84 of the first PD 14a is wire-bonded with one of the second electrodes 84 of the second PD 14b with a bonding wire 48a, another of the second electrodes 84 of the second PD 14b is wire-bonded with one of the second electrodes 84 of the third PD 14c with a bonding wire 48b, another of the second electrodes 84 of the third PD 14c is wire-bonded with one of the second electrodes 84 of the fourth PD 14d with a bonding wire 48c, and another of the second electrodes 84 of the fourth PD 14d is wire-bonded with an interconnection 22c on the second circuit board 22. Thus, the second electrodes 84 in two PDs neighbor to each other are wire-bonded.

FIG. 7 shows the arrangement where another of the second electrodes 84 of the fourth PD 14d is wire-bonded with the interconnection 22c. However, another of the second electrodes 84 of the first PD 14a may be wire-bonded with an additional interconnection on the first circuit board 21, which is not illustrated in FIG. 7. Those interconnections, 21a to 22c, are connected with the terminals 24 on the feedthrough 2B.

Figure 11:
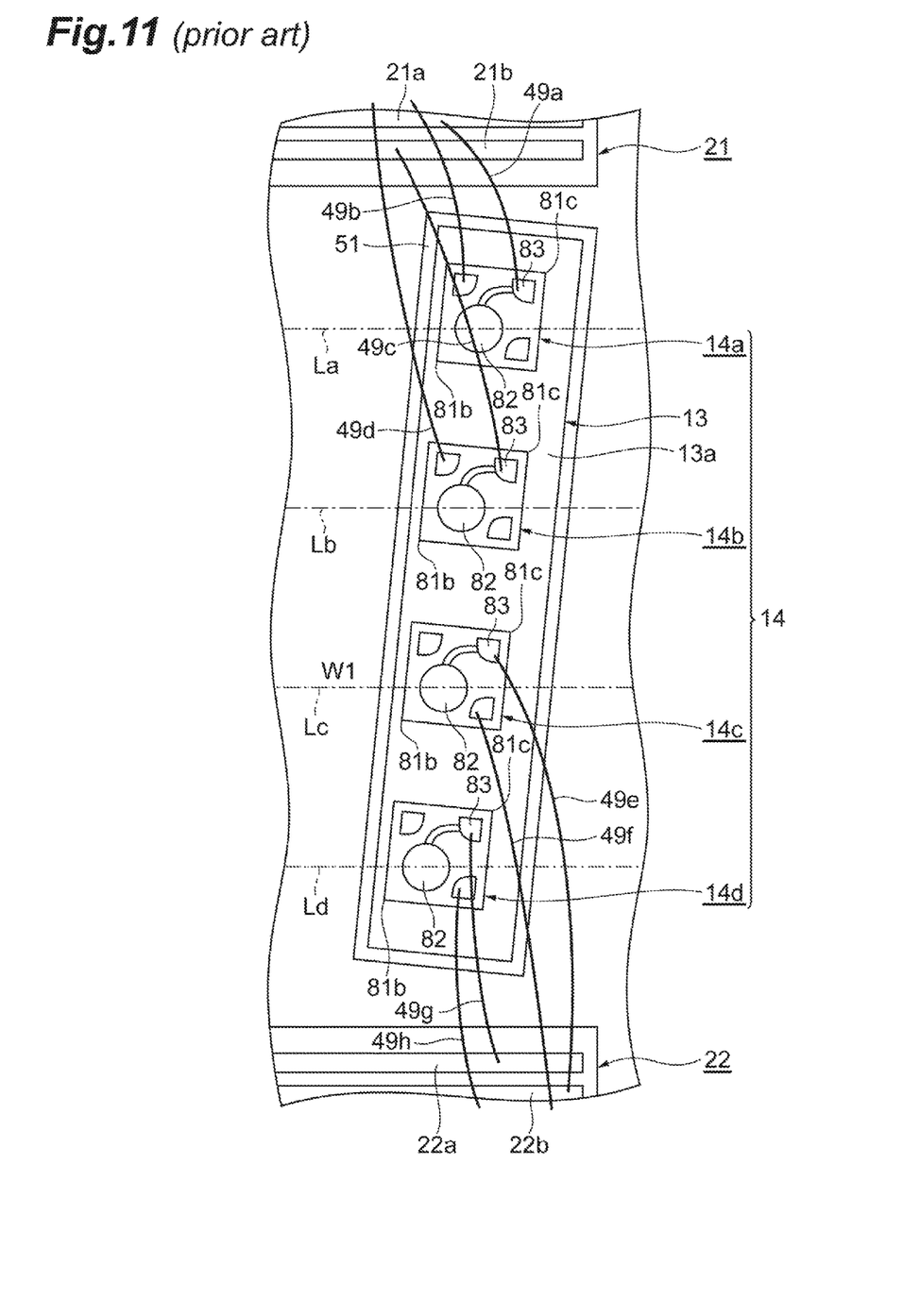
FIG. 11 is a plan view of a carrier and photodiodes according to a conventional arrangement of the photodiodes.

Advantages of the present embodiment will be described as referring to FIG. 11, which is a plan view showing a conventional arrangement of the PDs, 14a to 14d, in an optical transmitter apparatus and routings of the bonding wires, 49a to 49h. In the conventional arrangement, the PDs, 14a to 14d, are disposed in parallel displacement. Because the housing 2 in outer dimensions thereof is generally requested to follow a standard; a space allocated to the PDs, 14a to 14d, are restricted. In particular, the arrangement of the present embodiment requests additional spaces for the circuit boards, 21 and 22, in the respective sides of the BS 13; while, the light-sensitive areas 82 of the PDs, 14a to 14d, are necessary to be overlapped with the optical axes of the optical beams, La to Ld, which means that the PDs, 14a to 14d, in intervals therebetween are unable to be optionally narrowed.

Moreover, bonding wires, 48a to 49h, are extracted from respective electrodes, 83 and 84, that are formed on the PDs, 14a to 14b, to the interconnections, 21a to 22c, provided on the circuit boards, 21 and 22, that are placed in respective sides of the BS 13. In such an arrangement, total eight (8) bonding wires are necessary to extract signals from the PDs, 14a to 14d, to the interconnections, which inevitably make the routing of the bonding wires complex, and easily cause short circuits between the bonding wires.

On the other hand, in the present arrangement of the optical transmitting module 1A shown in FIG. 7, two PDs in one side of the housing 2 are disposed as rotated by 90° with respect to rest two PDs disposed closer to the other side of the housing 2. That is, the distance $W_1$ from the first corner 81b to the center of the BS 13 in two PDs, 14a and 14d, arranged in respective outer sides is longer than the distance $W_2$ from the second corner 81c to the center of the BS 13 in the two PDs, 14a and 14d, disposed in the inner side of the housing 2. Accordingly, although the light-sensitive areas 82 in the two PDs, 14a and 14d, are determined by the positions thereof by the optical axes, La to Ld; the arrangement may set the distance between the PDs, 14a to 14d, disposed in the outer side, which may narrow a space for mounting the PDs, 14a to 14d, namely, the mounting surface 13a of the BS 13, in particular, the lateral width of the BS 13.

When the second electrode 84 is connected with the n-type layer, the second and the third PDs, 14b and 14c, in the second electrodes 84 may be connected with the second electrodes 84 in the first and the fourth PDs, 14a and 14d, with the bonding wires 48a and 48c, respectively. Comparing this routing of the wires with an arrangement where the second electrodes 84 in the second and third PDs, 14b and 14c, are directly routed to the circuit boards, 21 and 22; intersections between wires may be reduced and the routing thereof becomes simple and easy. When the second electrodes 84 in the second and third PDs, 14b and 14c, are connected with the bonding wire 48b, the routing of the second electrode of the first PD 14a, or the fourth PD 14d, with the circuit board, 21 or 22, may be removed, which may further decrease possibility for wires to make intersection.

First Modification

Figure 8:
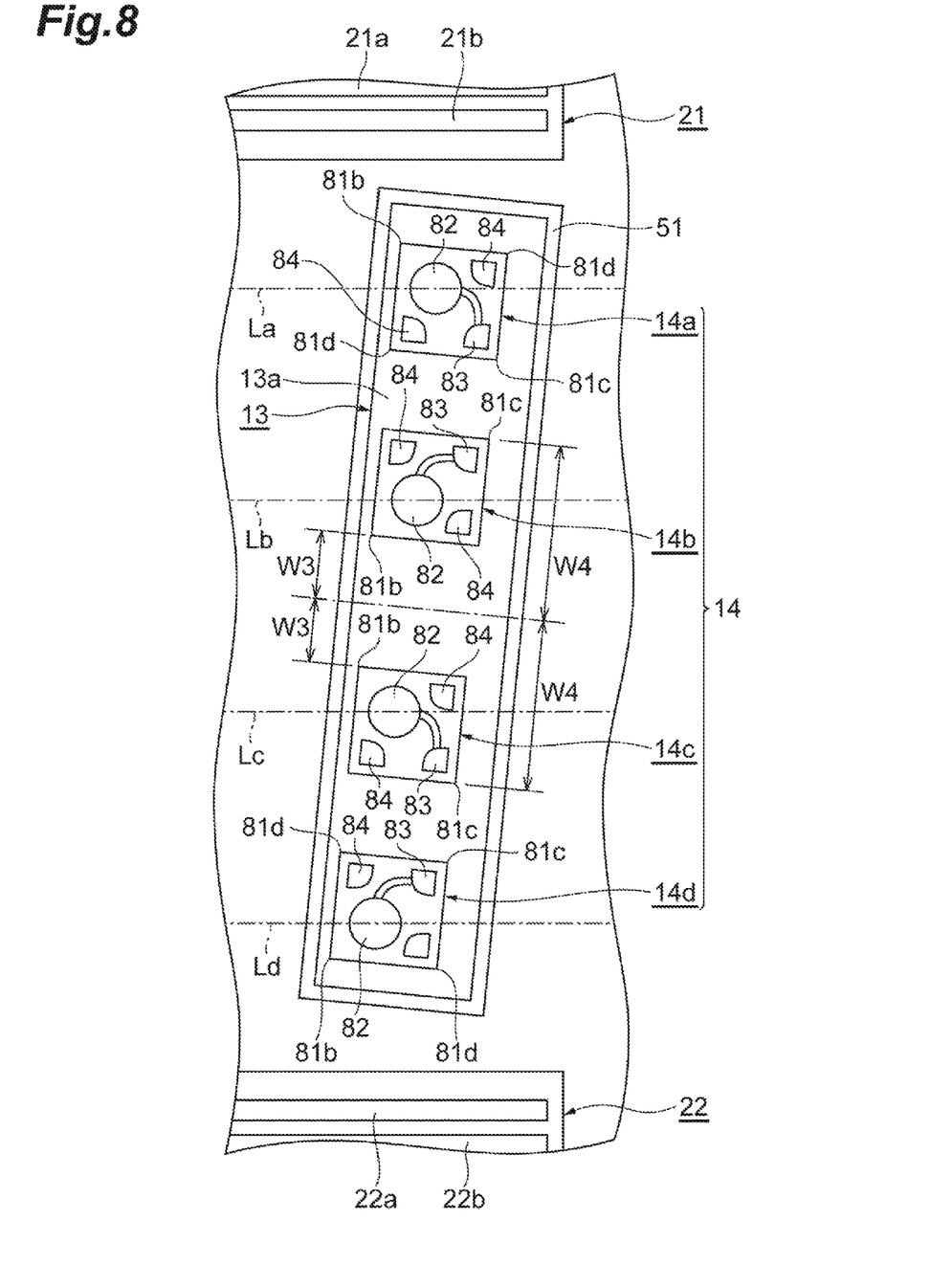
FIG. 8 is a magnified plan view of a carrier and photodiodes according to the first modification of the embodiment.

FIG. 8 is a plan view showing an arrangement of the PDs, 14a to 14d, on the BS 13 according to the first modification of the embodiment shown in FIGS. 5 and 7. A feature of the present modification distinguishable from those shown in FIG. 5 is that the inner PDs, 14b and 14c, are rotated in counter clock wise by 90° with respect to the outer two PDs, 14a and 14d. That is, the first corners 81b of two PDs, 14b and 14c, face to each other, while the second corners 81c of two PDs, 14a and 14b, those of two PDs, 14c and 14d, face to each other. Further specifically, twice of a distance $W_4$ between the second corner 81c of the PDs, 14b and 14c, and the center of the BS 13 is greater than twice of a distance $W_3$ between the first corner 81b of the PDs, 14b and 14c, and the center of the BS 13. This relation is opposite to that shown in FIG. 5 of the first embodiment. This arrangement sets the first electrodes 83 of the two PDs, 14b and 14c, in respective outer sides compared with the light-sensitive areas 82 thereof, which makes the first electrodes 83 of the two PDs, 14b and 14c, closer to the circuit boards, 21 and 22, and makes the routing of the bonding wires, 47b and 47c, simple and easy.

Second Modification

Figure 9:
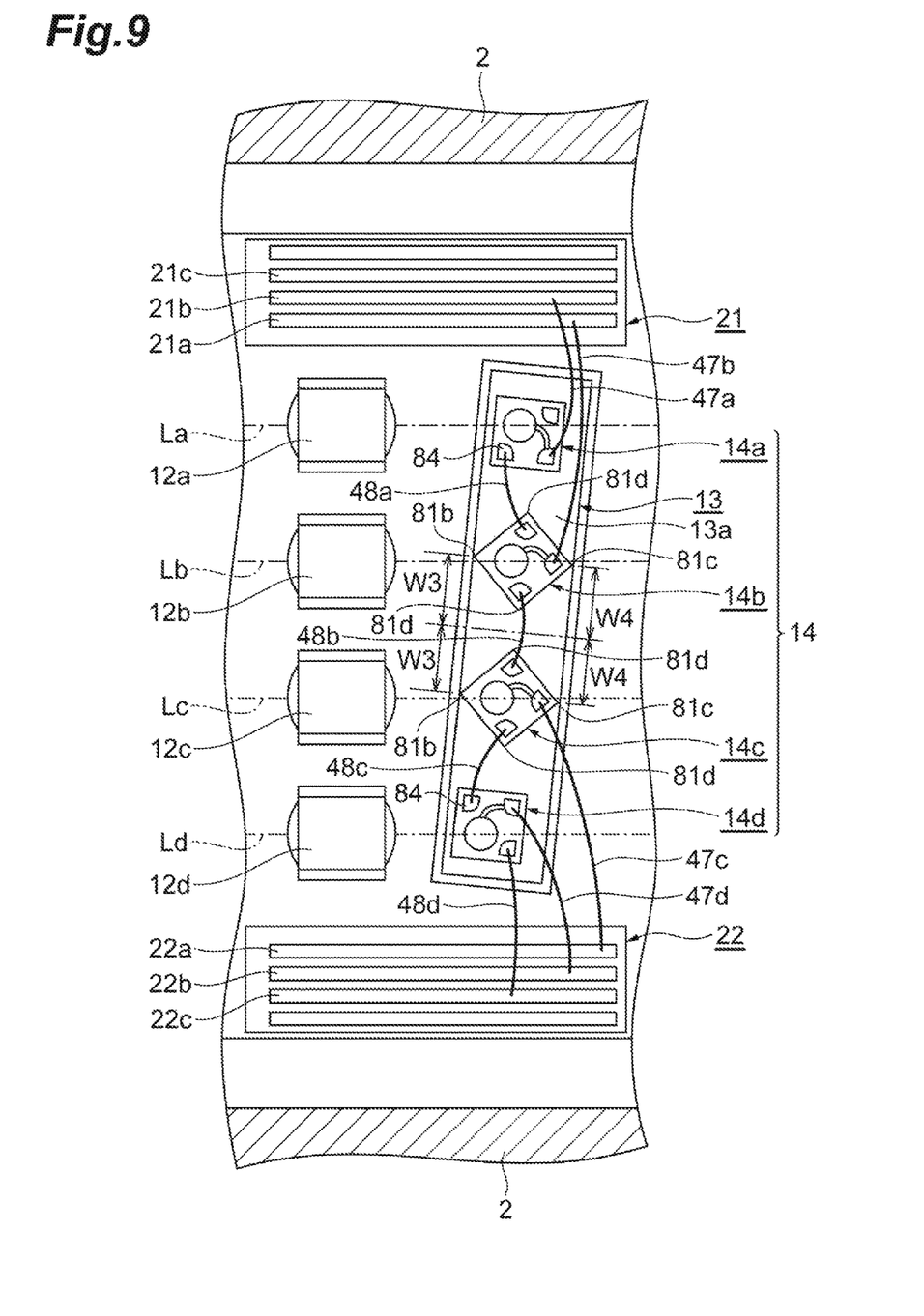
FIG. 9 is a magnified plan view of a carrier and photodiodes according to the second modification of the embodiment.

FIG. 9 is a plan view showing an arrangement of the PDs, 14a to 14d, on the BS 13. The arrangement shown in FIG. 9 has a feature that the inner two PDs, 14b and 14c, are rotated by 45° with respect to those of the first modification shown in FIG. 8. That is, virtual lines connecting the first and second corners, 81b and 81c, of the respective PDs, 14b and 14c, are roughly aligned with the optical axes, Lb and Lc. Two distances, $W_3$ and $W_4$, one of which is between the first corner 81b and the center of the BS 13, while, the other is between the second corner 81c and the center of the BS 13, become comparable. This arrangement for the inner PDs, 14b and 14c, sets the first electrodes 83 thereof further closer to the circuit boards, 21 and 22; thus, making the routing of the bonding wires, 47b and 47c, simple and easy.

The Second Embodiment

Figure 10:
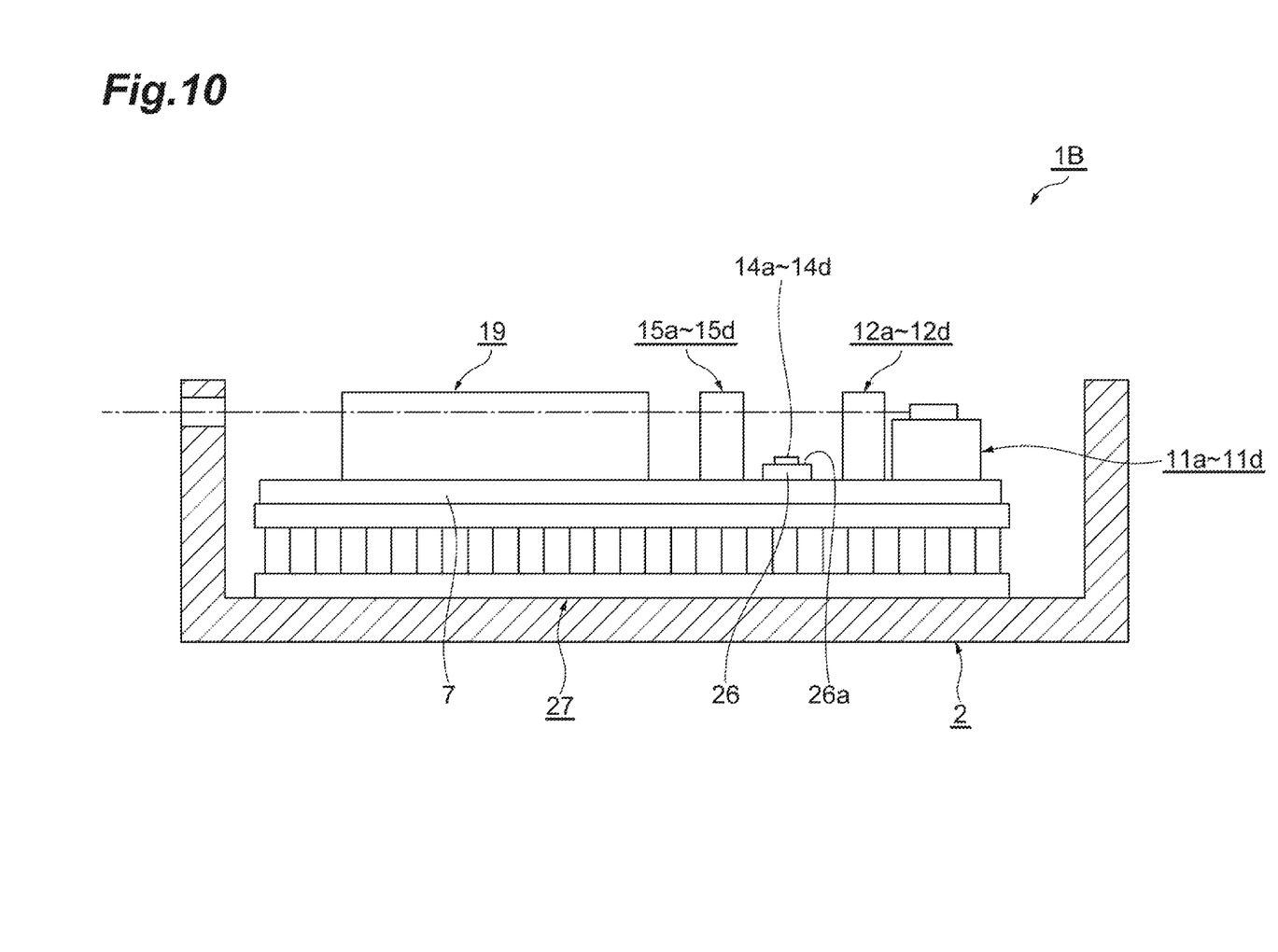
FIG. 10 shows a cross section of an optical transmitter apparatus according to the second embodiment.

FIG. 10 shows a cross section of another optical transmitter apparatus according to the second embodiment of the present invention. The second embodiment of the optical transmitter apparatus 1B provides no beam splitter but includes a thermo-electric cooler (TEC) 27 that mounts the optical modules, 11a to 11d, the first lenses, 12a to 12d, the second lenses 15a and 15d, and the optical multiplexing unit 19 thereon. The PDs, 14a to 14d, are also mounted on the TEC 27 through a carrier 26, specifically, on a primary surface 26a of the carrier 26. The TEC 8 may control temperatures of components mounted thereon.

The carrier 26, different from the BS 13 of the first embodiment, may not interrupt the optical axes, La to Ld; specifically, the optical axes, La to Ld, may pass a space above the PDs, 14a to 14d. The PDs, 14a to 14d, may receive dispersive or divergent beams output from the first lenses, 12a to 12d. Under such an arrangement between the PDs, 14a to 14d, and the optical axes, La to Ld, the routing of the bonding wires on the carrier 26 becomes further sensitive in levels thereof. When the wires are necessary to form a bell-shaped curve like the conventional arrangement shown in FIG. 11, the wire may interfere with the optical axis. Then, the arrangement of the PDs, 14a to 14d, may become effective.

While particular embodiment of the present invention have been described herein for purposes of illustration, further modifications and changes will become apparent to those skilled in the art. Accordingly, the appended claims are intended to encompass all such modifications and changes as fall within the true spirit and scope of this invention.

What is claimed is:

1. An optical transmitter apparatus capable of transmitting a number of optical signals each having a wavelength specific thereto and different from each other, the optical transmitter apparatus comprising:
    a number of optical modules each generating the optical signals and having respective optical axes;
    a number of photodiodes (PDs) each sensing power of the optical signals, the PDs each having a light-sensitive area, a first electrode, two second electrodes, and a rectangular plane shape,
    wherein the rectangular plane shape has four corners and two diagonals connecting respective two corners, the light-sensitive area, the first electrode, and the two second electrodes being arranged closer to respective corners putting a center of the rectangular plane shape therebetween, the light-sensitive area and the first electrode being arranged on one of the diagonals and electrically connected with the light-sensitive area, the two second electrodes being arranged on another of the diagonals and electrically connected to each other;
    a carrier that mounts the PDs thereon, the PDs being arranged in an array on the carrier that intersects the optical axes; and
    a housing having a space that encloses the optical modules, the PDs, and the carrier therein,
    wherein the PDs arranged outermost on the carrier in the first electrodes thereof dispose closer to the other of the PDs arranged inward on the carrier compared with the light-sensitive area thereof, and
    wherein one of the two second electrodes of one of the PDs is wire-bonded with one of the two second electrodes of another of the PDs arranged next to the one of the PDs.

2. The optical transmitter apparatus according to claim 1, wherein the optical transmitter apparatus includes at least four optical modules and four PDs, and
    wherein two PDs disposed outermost on the carrier face the first electrodes thereof toward the PDs disposed inward on the carrier.

3. The optical transmitter apparatus according to claim 1, wherein the optical transmitter apparatus includes at least four optical modules and four PDs, and
    wherein two PDs disposed next to the PDs disposed outermost arrange the diagonals thereof aligned with respective optical axes of the optical signals.

4. The optical transmitter apparatus according to claim 1, further comprising a circuit board arranged side-by-side with the carrier in the housing,
    wherein the PDs connect the first electrodes thereof with the circuit board and one of the PDs arranged closest to the circuit board connects the second electrode thereof with the circuit board.

5. The optical transmitter apparatus according to claim 1, wherein the light-sensitive area in the PD is offset from a center of the rectangular plane shape of the PD.

6. The optical transmitter apparatus according to claim 1, further comprising a number of first lenses that concentrate the optical signals output from the optical modules and a beam splitter that splits the optical signals, the beam splitter operating as the carrier that mounts the PDs thereon,
    wherein the PDs receive the optical signals split by the beam splitter as divergent beams.

7. The optical transmitter apparatus according to claim 1, further comprising a number of first lenses that concentrate the optical signals output from the optical modules,
    wherein the PDs on the carrier are arranged under the optical axes of the optical signals and receive the optical signals output from the first lenses.

8. The optical transmitter apparatus according to claim 1, wherein the PDs in the light-sensitive areas thereof are aligned with the respective optical axes.

9. An optical transmitter apparatus that transmits a plurality of optical signals having wavelengths specific thereto but different from each other, the optical transmitter apparatus comprising:
    a plurality of optical modules each generating the optical signals and having optical axes;
    a plurality of photodiodes (PDs) each sensing power of the optical signals, the PDs each having a light-sensitive area, a first electrode, two second electrodes, and a rectangular plane shape with a diagonal, where the light-sensitive area and the first electrode are arranged along the diagonal putting a center of the rectangular plane shape there between and electrically connected with each other on the rectangular plane shape; and a carrier that mounts the PDs thereon, the PDs being arranged in an array on the carrier that intersects the optical axes; and wherein two of the PDs arranged outermost on the carrier dispose the first electrode thereof closer to the other of the PDs arranged inward on the carrier compared with the light-sensitive area thereof, and one of the two second electrodes of one of the PDs is wire-bonded with one of the two second electrodes of another of the PDs arranged next to the one of the PDs.

10. The optical transmitter apparatus according to claim 9, wherein the two of the PDs arranged outermost on the carrier in the respective diagonals intersect to each other.

11. The optical transmitter apparatus according to claim 9, wherein the two of the PDs arranged outermost on the carrier are rotated by substantially 90°.

12. The optical transmitter apparatus according to claim 9, wherein the PDs further provide respective two second electrodes arranged on another diagonals of the rectangular plane shapes, the two second electrodes being electrically connected with each other, and wherein one of the two second electrodes of one of the PDs is wire-bonded with one of the two second electrodes of another of the PDs arranged next to the one of the PDs.

13. The optical transmitter apparatus according to claim 12, wherein the optical transmitter apparatus includes at least four optical modules and four PDs, and wherein two of the four PDs arranged inward on the carrier dispose the diagonals thereof substantially parallel to the respective optical axes of the optical signals.

14. The optical transmitter apparatus according to claim 12, further comprising a circuit board arranged side-by side with the carrier, wherein the PDs connect the first electrodes thereof with the circuit board and one of the PDs arranged closest t to the circuit board connects the second electrode thereof with the circuit board.

* * * * *